(12) United States Patent
Saiki et al.

(10) Patent No.: US 6,452,736 B1
(45) Date of Patent: Sep. 17, 2002

(54) MAGNETIC RECORDING AND REPRODUCING APPARATUS AND A READ/WRITE AMPLIFIER HAVING A SIGNAL TRANSMISSION SYSTEM WITH HIGH SPEED OF DATA WRITE SIGNAL

(75) Inventors: Eisaku Saiki; Shintaro Suzumura, both of Yokohama; Terumi Takashi, Chigasaki; Kazutoshi Ashikawa, Maebashi; Tsuguyoshi Hirooka, Fujisawa; Shoichi Miyazawa, Yokohama; Masashi Mori, Chigasaki, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/450,245

(22) Filed: May 25, 1995

(30) Foreign Application Priority Data

May 26, 1994 (JP) .............................................. 6-112772
Apr. 12, 1995 (JP) .............................................. 7-087069

(51) Int. Cl.⁷ .............................. G11B 5/09; G11B 5/02; G11B 5/07
(52) U.S. Cl. .............................. 360/46; 360/67; 360/68
(58) Field of Search .............................. 360/46, 51, 39, 360/67, 68

(56) References Cited

U.S. PATENT DOCUMENTS

| 4,000,513 A | * | 12/1976 | Precourt | 360/45 |
|---|---|---|---|---|
| 4,964,107 A | * | 10/1990 | Galbraith et al. | 360/51 |
| 5,028,922 A | * | 7/1991 | Huang | 360/48 |
| 5,243,604 A | * | 9/1993 | Tsang et al. | 371/40.1 |
| 5,340,940 A | * | 8/1994 | Lizuka et al. | 84/622 |
| 5,355,263 A | * | 10/1994 | Noguchi et al. | 360/70 |
| 5,359,631 A | * | 10/1994 | Behrens et al. | 360/46 |
| 5,481,554 A | * | 1/1996 | Kondo | 371/53 |
| 5,530,600 A | * | 6/1996 | Shrinkle | 360/46 |

OTHER PUBLICATIONS

T. Kawamura et al., "An Extremely Low–power Bipolar Current–mode I/O Circuit", 1994 Symposium on Electronic Information Communication, Autumn Conference.

* cited by examiner

Primary Examiner—Regina N. Holder
(74) Attorney, Agent, or Firm—Antonelli, Terry, Stout & Kraus, LLP (57) ABSTRACT

A magnetic recording and reproducing apparatus includes a read/write signal processor having a write data generator arranged to be of an interleave system and transmitting/receiving data to/from the read/write amplifier via a plurality of signal lines. In addition, the read/write amplifier has a compound circuit provided for the write data of the interleave system from the read/write signal processor and is formed as an integrated circuit, moreover, a 1/2 prescaler is provided at the output of the write data generator, transmitting and receiving write data in Non-Return-To-Zero-Interleave CODE.

8 Claims, 13 Drawing Sheets

WRITE DATA AFTER CODING 0 1 0 0 1 0 1 0 1 0 0 0 0 1 0 0 1 0

WRITE DATA AFTER CODING

MAGNETIC RECORDING AND REPRODUCING APPARATUS AND A READ/WRITE AMPLIFIER HAVING A SIGNAL TRANSMISSION SYSTEM WITH HIGH SPEED OF DATA WRITE SIGNAL

BACKGROUND OF THE INVENTION

This invention relates to magnetic recording and reproducing apparatus, and particularly to the transmission of write data and read data signals between the read/write signal processing circuit and read/write amplifier which are used when data is recorded on a recording medium.

Figure 16:
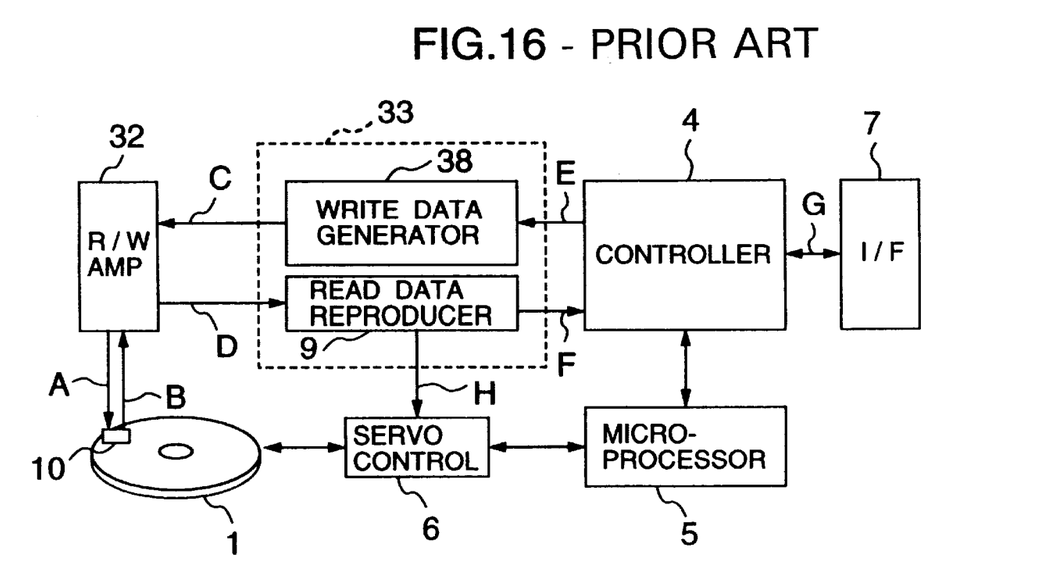
FIG. 16 is a block diagram of one example of the conventional magnetic recording and reproducing apparatus.

The conventional magnetic recording and reproducing apparatus is generally comprised of, as shown in FIG. 16, a disk-like magnetic recording medium 1, a magnetic head 10, a write/read (R/W) amplifier 32, an R/W signal processor 33, a controller 4, a microprocessor 5, a servo controller 6 and an interface (I/F) circuit 7. The R/W signal processor 33 is formed of a write data generator 38 and a read data reproducer 9.

The record data transmitted from a host computer (hereinafter, the host) not shown is supplied to the R/W signal processor 33 through the I/F circuit 7 and controller 4. The write data generator 38 converts this record data into a recording code which is suitable for being recorded on the magnetic recording medium 1. This code is supplied to the R/W amplifier 32, and fed to the magnetic head 10 by which it is written on the magnetic recording medium 1. When the data is read from the medium 1 by the magnetic head 10, it is amplified by the R/W amplifier 32 and then decoded by the read data reproducer 9 of the R/W signal processor 33. The decoded signal is fed through the controller 4 and I/F circuit 7 to the host.

The servo controller 6 and microprocessor 5 control the magnetic head 10 to be positioned on the magnetic recording medium 1 and control the medium 1 to be rotated. In the data side servo system, part of the data read from the medium 1 is used as servo data. The read data reproducer 9 extracts this servo data signal, H from the input data and used to control the magnetic head 10 to be positioned.

Also, the R/W signal processor 33 has a register, though not shown, by which the characteristics of respective portions can be switched. This register can be set in a programmable manner by a control signal which is, though not shown, fed from the microprocessor 5.

Figure 17:
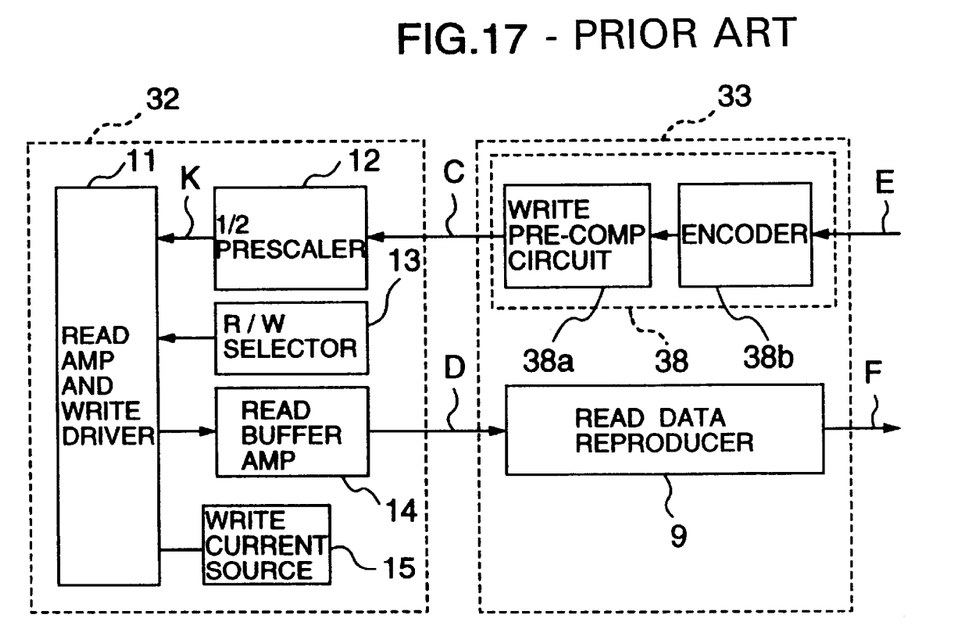
FIG. 17 is a block diagram of one example of the R/W amplifier and R/W signal processor in FIG. 16.

FIG. 17 is a block diagram of one example of the R/W amplifier 32 and R/W signal processor 33 shown in FIG. 16.

Referring to FIG. 17, the R/W amplifier 32 is comprised of a read amp. and write driver 11, a 1/2 prescaler 12, a read/write selector 13, a read buffer amplifier 14, and a write current source 15. The read amp. and write driver 11 is connected to the magnetic head 10 and has amplifiers and drivers of which the numbers are equal to that of the magnetic head. The R/W signal processor 33 has the write data generator 38 and read data reproducer 9, and the write data generator 38 has a write precompensation circuit 38a and an encoder 38b.

Figure 18:
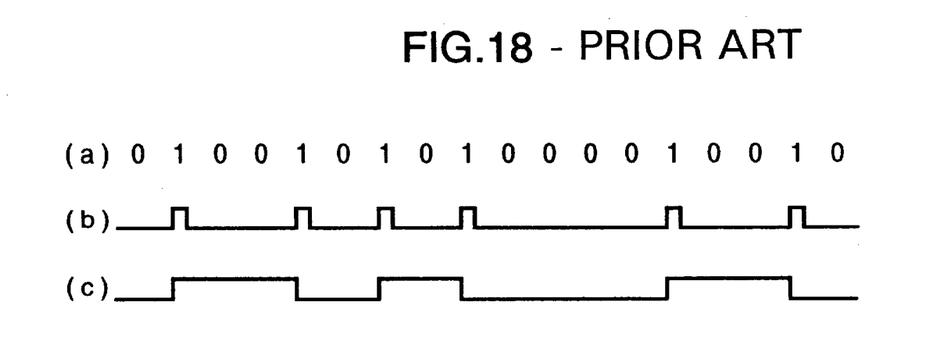
FIG. 18 is a waveform diagram showing ideal waveforms of write data transmitted from the R/W signal processor to R/W amplifier in FIG. 17.

The record data E supplied from the host through the I/F circuit 7 and controller 4 shown in FIG. 16 is converted by the encoder 38b into a recording code such as 1-7RLLC or 8/9GCR which is, as shown in FIG. 18(a), suitable for being recorded on the magnetic recording medium. This recording code is further processed to be a data pulse signal C, or shifted in edge phase at each data pattern, by the write precompensation circuit 38a in order that the peak shift due to the magnetization interference or the like can be reduced. The data pulse signal C is fed to the R/W amplifier 32. The data pulse signal C is a serial RZ (return-to-zero) code as shown in FIG. 18(b).

This data pulse signal C is converted by the 1/2 prescaler 12 of the R/W amplifier 32 into a NRZI (non-return-to-zero-inverted) code K as shown in FIG. 18(c). The current pulse according to this code K is supplied from the write driver 11 to the magnetic head 10. As a result, data is recorded on the magnetic recording medium 1 shown in FIG. 16.

In general, since the R/W amplifier 32 is located close to the magnetic head 10, the R/W amplifier 32 and the R/W signal processor 33 are separate integrated circuits (ICs) and connected by a film-shaped cable.

The read/write selector 13 is a switching circuit for read and write operations. It stops the operation of the write driver at the time of reading and stops the operation of the read amplifier at time of writing. The write current source 15 is used to set the output current from the write driver.

The read buffer amplifier 14 amplifies the analog read data signal from the read amplifier 11 and transmits it to the read data reproducer 9. The read data reproducer 9 reproduces the read data from the read signal D fed from the read buffer amplifier 14, decodes the recording code into the original data and supplies it to the controller 4 shown in FIG. 16.

The write data C transmitted between the R/W signal processor 33 and the R/W amplifier 32 is in the form of TTL or ECL level voltage.

The read data signal D transmitted between the R/W signal processor 33 and the R/W amplifier 32 is also in the form of an analog voltage level.

The magnetic disk player has been so far improved year after year in its data transfer speed. In order to further speed up the data transfer operation, it is necessary to consider the system for transmitting write data signal and read data signal between the R/W signal processor IC 33 and the R/W amplifier IC 32.

The film cable used for connecting these ICs has a low transmission capability, or it easily dulls the waveform of the high-frequency pulse signal.

The reason is that the cable is necessary to be flexible for easy mounting in the recording and reproducing apparatus and to be inexpensive for low cost of the apparatus, with the result that the cable has a high characteristic impedance and large loss in its conductor and insulator.

Figure 19:
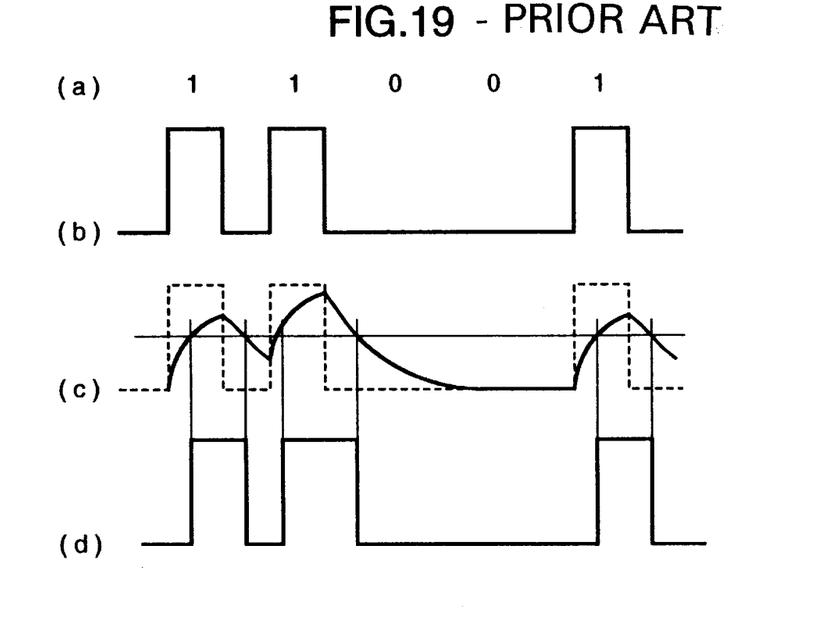
FIG. 19 is a waveform diagram showing the actual waveforms of write data transmitted from the R/W signal processor to R/W amplifier in FIG. 17.

FIG. 19 shows the waveforms of write data pulse signal in the conventional magnetic disk player. When the write data train (1, 1, 0, 0, 1) of the recording code as shown in FIG. 19(a) is transmitted at high speed, the ideal pulse waveform is shown in FIG. 19(b), but the actual waveform is blunt as shown by the solid line in FIG. 19(c). When the blunt read signal is shaped in its waveform by the R/W amplifier 32, the obtained pulse signal is shifted in the phase relation between the leading and trailing edges as shown in FIG. 19(d). This phase shift is caused according to the crowded or scattered pulses (the distance between "1" bits) of the original data pattern shown in FIG. 19(a). In addition, the amplitude is reduced so that the level margin is decreased, causing error in data.

The data transfer speed of the magnetic disk player or the like has recently increased up to 10 MB/sec or above, and thus the specification for the timing margin has become strict. In the present magnetic disk player, since the RZ coding system is used for the write data transmission between the R/W signal processor IC and the R/W amplifier IC, the write data frequency at a transfer speed of 10 MB/sec is 90 MHz for 8/9GCR and 60 MHz for 1-7RLLC.

In the present magnetic disk player having a film cable of about 100-mm in length and connectors, the write data transmission line between the R/W signal processor IC and the R/W amplifier IC has an inductance component of 100 nH and a capacitance component of 20 pF or above considering the conductors on the wiring board and the input/output terminals of ICs, and thus the transmission frequency is limited to about 100 MHz even for ECL level. Therefore, in the present system, data cannot be transferred at a high speed of 20 MB/sec or above.

Also, even if a high-performance cable with the above drawback obviated is used, a high-speed drive buffer is needed and thus the consumption power and cost are increased.

In addition, there has been U.S. Pat. No. 5,404,250 as a related art.

SUMMARY OF THE INVENTION

It is an object of the invention to provide a magnetic recording and reproducing apparatus with the above problems solved, or capable of reducing the consumption power and the cost and also of speeding up the operation and a semiconductor integrated circuit for use in the apparatus.

According to one aspect of this invention, to achieve the above object, there is provided a magnetic recording and reproducing apparatus of which the R/W signal processor has the write data generator arranged to be of an interleave system and transmits/receives data to/from the R/W amplifier via a plurality of signal lines. In addition, the R/W amplifier of the invention has a compound circuit provided for the write data of the interleave system from the R/W signal processor and is formed as an integrated circuit.

Moreover, a 1/2 prescaler is provided at the output of the write data generator, thereby making it possible to transmit and receive write data in NRZI code.

Also, a differential buffer and receiver are provided, thereby making it possible to transmit and receive write data in the form of differential signals.

According to another aspect of the invention, there is provided a magnetic recording and reproducing apparatus in which a current mode output circuit is provided at the write data output portion of the R/W signal processor, and a current mode input circuit is provided at the write data input portion of the R/W amplifier so that the write data between the R/W signal processor and the R/W amplifier can be transmitted in a current mode.

Also, a current switching circuit is provided at the current mode output circuit, thereby making it possible to switch the output current on or off.

Moreover, a register is provided, thereby making it possible to set the current switching circuit in a programmable manner under the control of the microprocessor.

According to another aspect of the invention, there is provided a magnetic recording and reproducing apparatus in which a current mode output circuit is provided at the read data output portion of the R/W amplifier, and a current mode input circuit is provided at the read data input portion of the R/W signal processor so that the read data between the R/W signal processor and the R/W amplifier can be transmitted in a current mode.

Since the write data signal is transmitted between the R/W amplifier and the R/W signal processor via a plurality of signal lines according to the interleave system, the frequency of the signal transmitted on a single signal line can be reduced.

In addition, since the write data signal between the R/W amplifier and the R/W signal processor is transmitted in NRZI code, the signal frequency can be reduced.

Therefore, even though the R/W amplifier is formed as an IC and connected to the R/W signal processor by an inexpensive transmission line, the phases of the transmitted write data signal at its leading edges and trailing edges are prevented from shifting due to the waveform distortion.

Since the write data signal between the R/W amplifier and the R/W signal processor is transmitted in a current mode, the signal amplitude can be reduced, and thus the consumption power in the output circuit of the R/W signal processor can be decreased.

Also, since the read data signal between the R/W amplifier and the R/W signal processor is transmitted in a current mode, the signal amplitude can be reduced and thus the consumption power in the output circuit of the R/W amplifier can be decreased.

In addition, since the signal amplitude can be decreased by transmitting each signal in a current mode, the amount of generated noise can be decreased and noise can be prevented from entering in the surrounding circuits.

Moreover, since the input impedance of each current mode input circuit can be adjusted by bias current, impedance matching can be achieved without the need to add a termination resistor to the film cable which has its own characteristic impedance, and thus the number of components used can be decreased.

Thus, according to this invention, the write data signal between the R/W amplifier and the R/W signal processor can be transmitted at a low frequency, and the magnetic recording and reproducing apparatus can be operated at a high transfer speed and low consumption power.

According to this invention, the write data signal and read data signal between the R/W amplifier and the R/W signal processor can be transmitted in a small-amplitude current mode, and both low consumption power and high transfer speed can be achieved.

Also, since data of small amplitude is transmitted, the amount of noise generated can be reduced.

Moreover, since the output current can be adjusted by the microprocessor, impedance matching to the film cable can be achieved without use of a termination resistor, and thus the number of discrete components used can be decreased, resulting in low cost. In addition, since it is possible to save the space around the R/W amplifier IC which space is not wide enough for components to be mounted on, the recording and reproducing apparatus can be produced at low cost and small-sized.

Furthermore, according to this invention, the write data signal and read data signal can be transmitted in a current mode, and thus both high transfer speed and low consumption power can be achieved.

The other objects, features and advantages of the invention will be fully understood by the following description with reference to the accompanying drawings.

DESCRIPTION OF THE PREFERRED EMBODIMENTS

One embodiment of the invention will be described with reference to the accompanying drawings.

Figure 1:
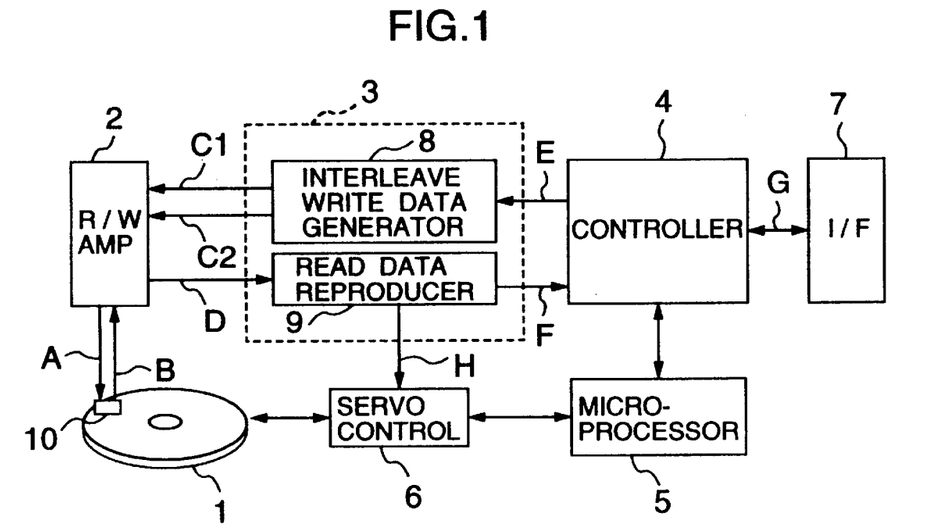
FIG. 1 is a block diagram of one embodiment of the magnetic recording and reproducing apparatus of the invention.

Referring to FIG. 1, there are shown the magnetic recording medium 1, the magnetic head 10, an R/W amplifier 2, an R/W signal processor 3, the controller 4, the microprocessor 5, the servo controller 6 and the I/F circuit 7, which constitute one embodiment of a magnetic recording and reproducing apparatus of the invention. The R/W signal processor 3 is formed of the interleave write data generator 8 and the read data reproducer 9. In FIG. 1, like elements corresponding to those in FIG. 16 are identified by the same reference numerals and will not be described.

Figure 2:
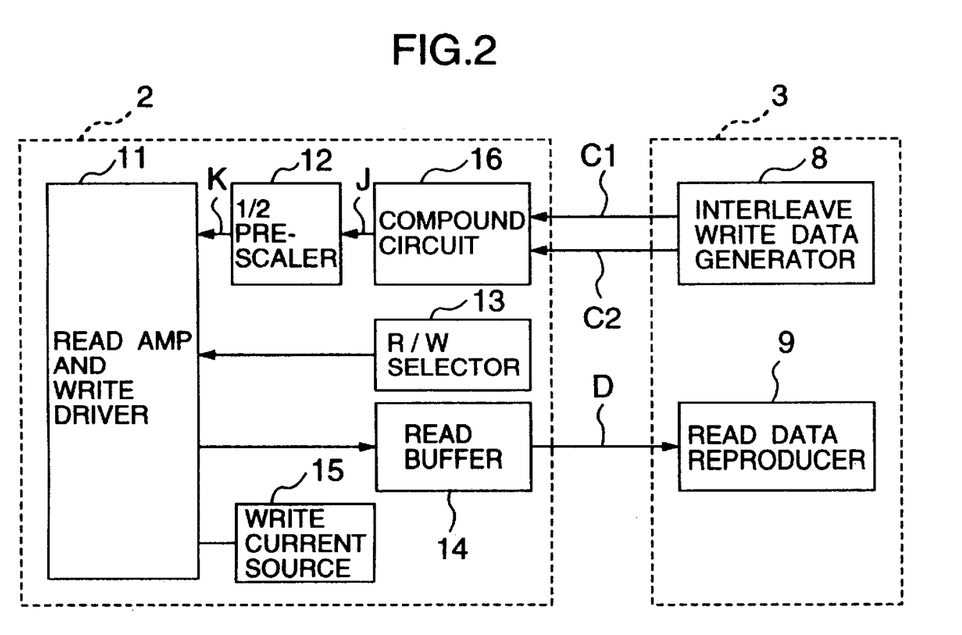
FIG. 2 is a block diagram of a specific example of the R/W amplifier and R/W signal processor shown in FIG. 1.

FIG. 2 is a block diagram of a specific example of the R/W amplifier 2 and the R/W signal processor 3 in FIG. 1. In FIG. 2, reference numeral 16 represents a compound circuit, and like elements corresponding to those in FIG. 1 and FIG. 17 are identified by the same reference numerals.

In FIG. 2, the R/W amplifier 2 is comprised of the read amp. and write driver 11, the 1/2 prescaler 12, the read/write selector 13, the read buffer amplifier 14, the write current source 15 and the compound circuit 16. In other words, the compound circuit 16 is added to the conventional R/W amplifier 32 shown in FIG. 17. In addition, as is similar to the R/W amplifier 32 shown in FIG. 17, the read amp. and write driver 11 of the R/W amplifier 2 is connected to the magnetic head 10, and actually a plurality of amplifiers 2 (i.e. a plurality of drivers) are used the number of which is equal to or larger than that of the elements of the magnetic head 10.

Figure 3:
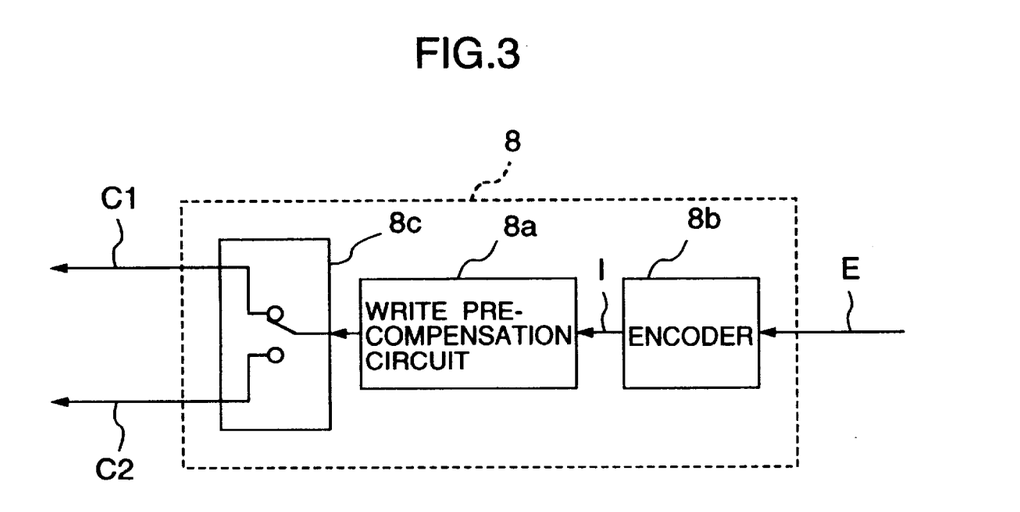
FIG. 3 is a block diagram of a specific example of the interleave write data generator shown in FIG. 2.

FIG. 3 is a block diagram of a specific example of the interleave write data generator 8 in FIGS. 1 and 2. The interleave write data generator 8 is formed of an encoder 8b, a write precompensation circuit 8a and an interleave switch 8c.

The operation of this embodiment will be described with reference to FIG. 4 which is a timing chart for signals at respective portions in FIGS. 2 and 3.

Referring to FIG. 1, the record data E transmitted from the host through the I/F circuit 7 and controller 4 is supplied to the R/W signal processor 3. The encoder 8b shown in FIG. 3 converts the data E into a data train I of a code such as 1-7RLLC or 8/9GCR which is suitable for being recorded on the magnetic recording medium 1. The record data E may be transmitted in the form of parallel data which is advantageous for high speed transfer. The data train I of this recording code is fed to the write precompensation circuit 8a.

The write precompensation circuit 8a is used for precompensation at the time of writing (recording) in order to reduce the peak shift of read data due to magnetization interference or the like. The phase of the edges of the data pulse signal is shifted forward or backward by this circuit according to the data pattern. This data pulse signal is fed to the interleave switch 8c, by which the pulses of "1" bit (hereinafter, referred to as "1" pulses) are alternately switched so that it is divided into an interleave write data pulse signal C1 of every other "1" pulses and an interleave write data pulse signal C2 of the remaining "1" pulses. These pulse signals are supplied to the R/W amplifier 2.

Figure 4:
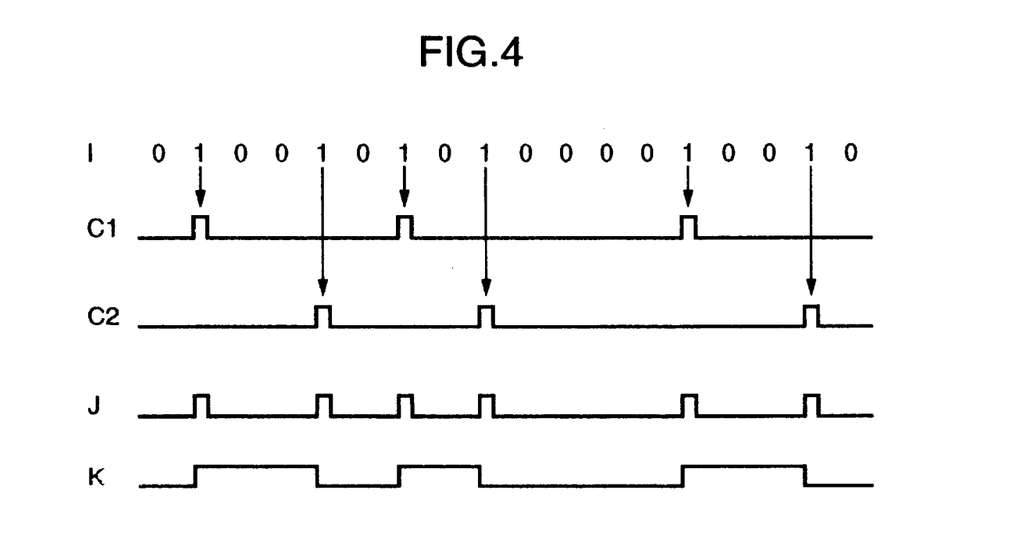
FIG. 4 is a timing chart for signals at respective portions in FIG. 3.

Each of these interleave write data pulse signals C1 and C2 is an interleave RZ (return-to-zero) code which is produced as a result of thinning the original data pulse signal at every other "1" pulses as shown in FIG. 4.

Figure 5:
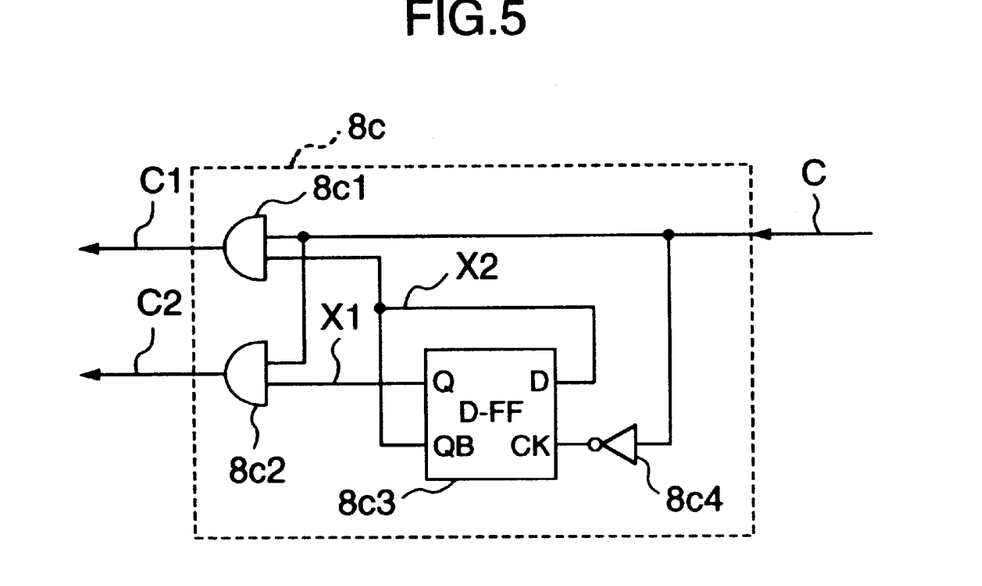
FIG. 5 is a circuit diagram of a specific example of the interleave switch shown in FIG. 3.

FIG. 5 is a circuit diagram of a specific example of the interleave switch 8c in FIG. 3. This switch 8c includes AND gates 8c1 and 8c2, a D-type flip-flop (hereinafter, abbreviated D-FF) 8c3, and an inverter 8c4.

Figure 6:
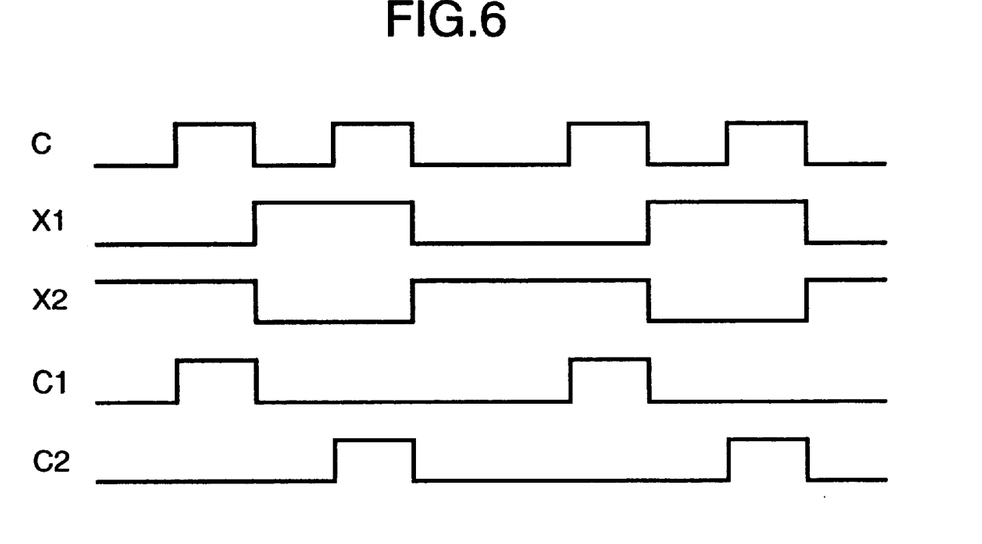
FIG. 6 is a timing chart for signals at respective portions in FIG. 5.

FIG. 6 is a timing chart showing the signals at respective portions in FIG. 5. In FIG. 6, like signals corresponding to those in FIG. 5 are identified by the same reference numerals.

In FIGS. 5 and 6, the data pulse signal C produced from the write precompensation circuit 8a shown in FIG. 3 is supplied to the AND gates 8c1 and 8c2, and also it is inverted by the inverter 8c4 and fed as a clock ck to the D-FF 8*c*3. This D-FF 8*c*3 is actuated by the leading edge of the clock ck, or by the trailing edge of the data pulse signal C to receive at its D input terminal a gate pulse X2 which has the opposite polarity to the Q output of the D-FF 8*c*3 and which is produced from its QB output terminal.

If the Q output and QB output of the D-FF 8*c*3 are "L" (low level) and "H" (high level), respectively, the gate pulse X2 of "H" from the QB terminal is fed to the AND gate 8*c*1, and the gate pulse X1 of "L" from the Q terminal to the AND gate 8*c*2. Thus, the AND gate 8*c*1 is turned on, and the AND gate 8*c*2 is turned off.

Under this state, when the "1" pulse of the data pulse signal C is supplied to this switch 8*c*, this "1" pulse is passed through the AND gate 8*c*1, and the D-FF 8*c*3 is actuated by the trailing edge of this "1" pulse to receive "H" at its D terminal. As a result, the Q output is "H" and the QB output is "L". Thus, the AND gate 8*c*1 is turned off, and the AND gate 8*c*2 is turned on.

Then, when the "1" pulse of data pulse signal C is again fed to the switch, this "1" pulse is passed through the AND gate 8*c*2, and the D-FF 8*c*3 is actuated by the trailing edge of the "1" pulse to receive "L" at the D terminal. As a result, the Q output is "L" and the QB output is "H". Thus, the AND gate 8*c*1 is turned on, and the AND gate 8*c*2 is turned off.

Thereafter, since the same operation is made, the successive "1" pulses of the data pulse signal C are passed through the alternate AND gates 8*c*1 and 8*c*2. Therefore, the interleave write data signal C1 having every other "1" pulses of data pulse signal C is produced from the AND gate 8*c*1, and the interleave write data signal C2 having the remaining "1" pulses of data pulse signal C from the AND gate 8*c*2.

Figure 7:
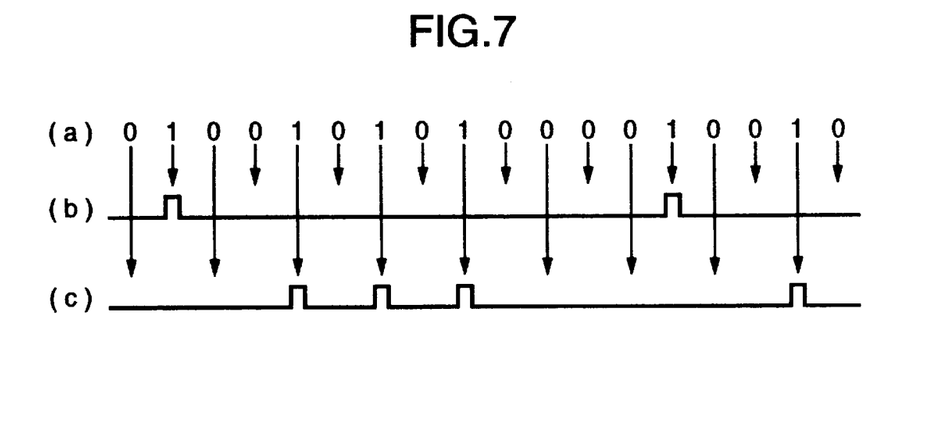
FIG. 7 is a timing chart showing another specific example of the interleave system in the embodiment of FIG. 1.

The interleave data can be generated by another way. That is, every bits of the data pulse signal shown in FIG. 7(*a*) are alternately distributed to two parts, thereby generating data pulse signals shown in FIGS. 7(*b*) and (*c*). This method is effective for a recording code of successive "1" bits such as 8/9GCR.

While the number of the interleave data is two in this embodiment, three or more interleave data can easily be produced in the same way.

In this embodiment, the interleave write data generator 8 generates two or more interleave write data pulse signals by alternately picking up every other "1" pulses of the write data or by alternately picking up every bits of the write data.

The compound circuit 16 of the R/W amplifier 2 combines these two interleave write data pulse signals C1 and C2 to thereby generate the original data pulse signal J. This compound circuit 16 can be formed of, for example, an OR circuit. This data pulse signal J is divided in its frequency by the 1/2 prescaler 12, thereby converted into the signal K of NRZI (non-return-to-zero-inverted) code. The current pulse corresponding to the signal K is supplied from the write driver 11 to the magnetic head 10, by which data is recorded on the magnetic recording medium 1.

Figure 8:
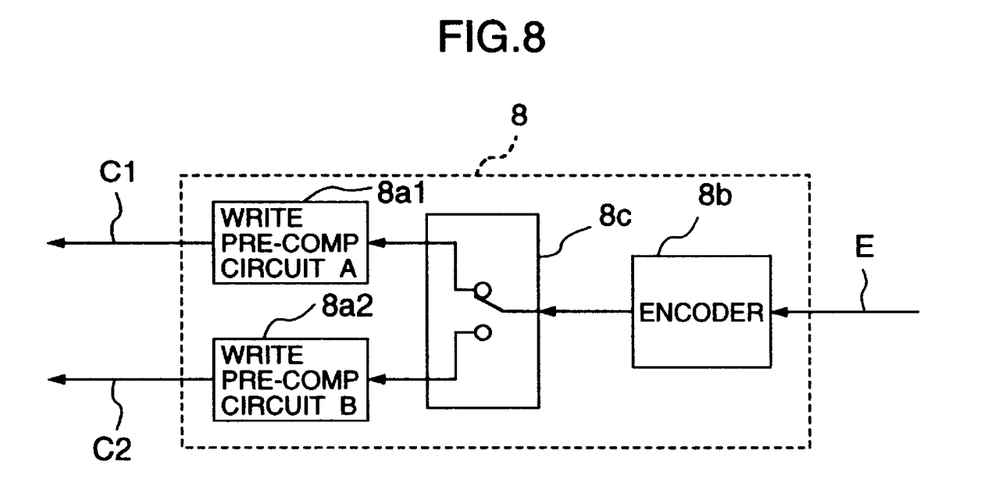
FIG. 8 is a block diagram of another specific example of the interleave write data generator shown in FIG. 2.

FIG. 8 is a block diagram of another specific example of the interleave write data generator 8 shown in FIGS. 1 and 2. In this example, the interleave switch 8*c* is provided at the following stage of the encoder 8*b*. The same output signal from the encoder 8*b* as that from the write precompensation circuit 8*a* shown in FIG. 3 is fed to the interleave switch 8*c* where it is interleaved as above. The interleave write data pulse signals thus generated are respectively corrected by the write precompensation circuits 8*a*1 and 8*a*2. This arrangement has the advantage that the operation speed of the write precompensation circuits 8*a*1 and 8*a*2 can be decreased.

Figure 9:
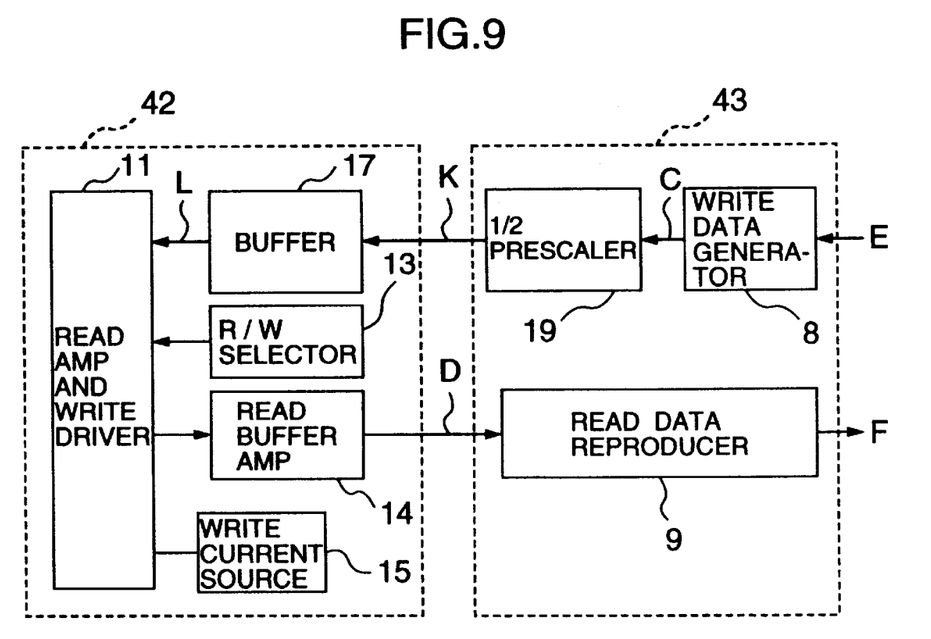
FIG. 9 is a block diagram of the R/W amplifier and R/W signal processor in another embodiment of the recording and reproducing apparatus of the invention.

FIG. 9 is a block diagram of the R/W amplifier 42 and R/W signal processor 43 in another embodiment of the magnetic recording and reproducing apparatus of the invention. In FIG. 9, like elements corresponding to those in FIG. 2 are identified by the same reference numerals and will not be described.

In FIG. 9, the R/W amplifier 42 is comprised of the read amp. and write driver 11, the read/write selector 13, the read buffer amplifier 14, the write current source 15 and a buffer 17. The R/W signal processor 43 is comprised of a 1/2 prescaler 19, a write data generator 18 and the read data reproducer 9.

Figure 10:
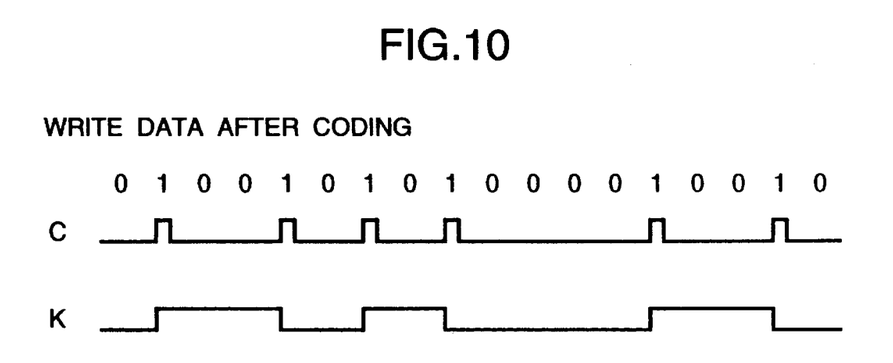
FIG. 10 is a timing chart for signals at respective portions in FIG. 9.

In FIG. 9, the write data generator 18 of the R/W signal generator 43 is equivalent to the write data generator 38 of the R/W signal processor 33 shown in FIG. 17. The coded write data (FIG. 10) from the encoder (corresponding to the encoder 38*b* in FIG. 17) of the write data generator is corrected as above by the write precompensation circuit (corresponding to the write precompensation circuit 38*a* in FIG. 17) and produced as the write data pulse signal C shown in FIG. 10. This write data pulse signal C is divided in its frequency by the 1/2 prescaler 19 and fed as the write data pulse signal K of NRZI code shown in FIG. 10 to the R/W amplifier 42.

Thus, in this embodiment, the write data pulse signal K is transmitted in NRZI code between the R/W amplifier 42 and the R/W signal processor 43. Therefore, the write data can be transmitted at a low frequency, and thus the apparatus can be operated at high speed. In addition, the consumption power can be reduced since the operating frequency is low.

Figure 11:
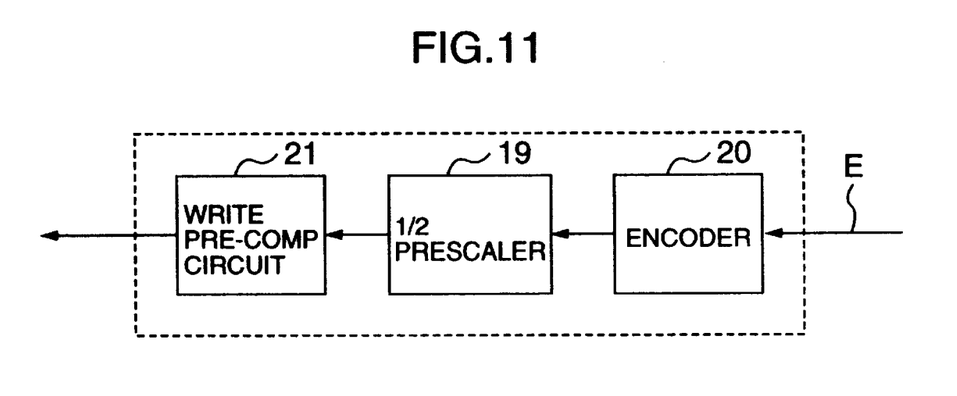
FIG. 11 is a block diagram of a modification of the example of FIG. 9.

FIG. 11 shows a modification of the arrangement order of the write data generator 18 and the 1/2 prescaler 19 shown in FIG. 9. In other words, the 1/2 prescaler 19 is arranged between the encoder 20 and the write precompensation circuit 21.

According to this arrangement, the record data E produced from the controller 4 (FIG. 1) is converted by the encoder 20 into a code suitable for being recorded, and then processed to be a signal of NRZI code by the 1/2 prescaler 19. This signal is corrected by the write precompensation circuit 21, as is similar to the correction in the write precompensation circuit 38*a* shown in FIG. 17, and it is fed to the R/W amplifier 42. The advantage of this arrangement is that it is possible to reduce the frequency of the write data pulse signal to be treated in the write precompensation circuit 21.

Figure 12:
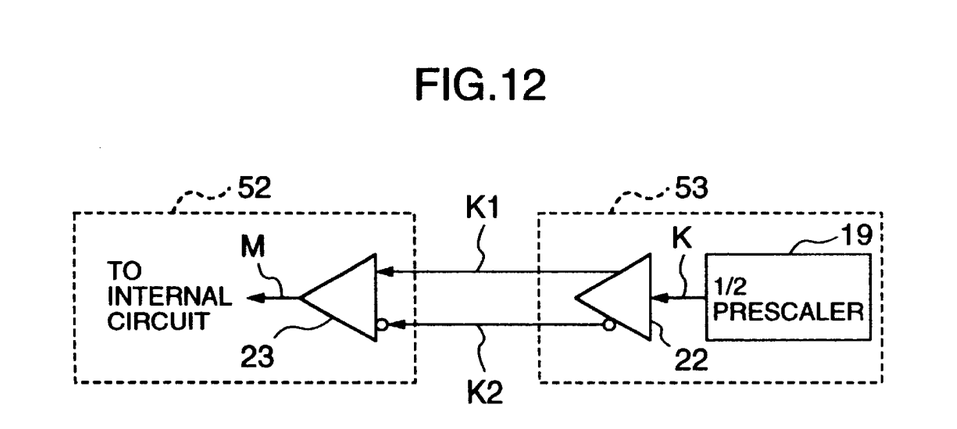
FIG. 12 is a block diagram of a main part of the R/W amplifier and R/W signal processor in still another embodiment of the magnetic recording and reproducing apparatus of the invention.

FIG. 12 is a block diagram of a main part of the R/W signal processor 53 in still another embodiment of the magnetic recording and reproducing apparatus of the invention.

In FIG. 12, the R/W signal processor 53 has a differential buffer 22 provided at the output stage of the 1/2 prescaler 19, and the R/W amplifier 52 has a differential receiver 23 provided at its input stage. Differential write data pulse signals K1 and K2 are transmitted between the differential buffer 22 and the differential receiver 23.

The effect of the differential form of the write data pulse signal C will be described with reference to FIG. 13.

Figure 13:
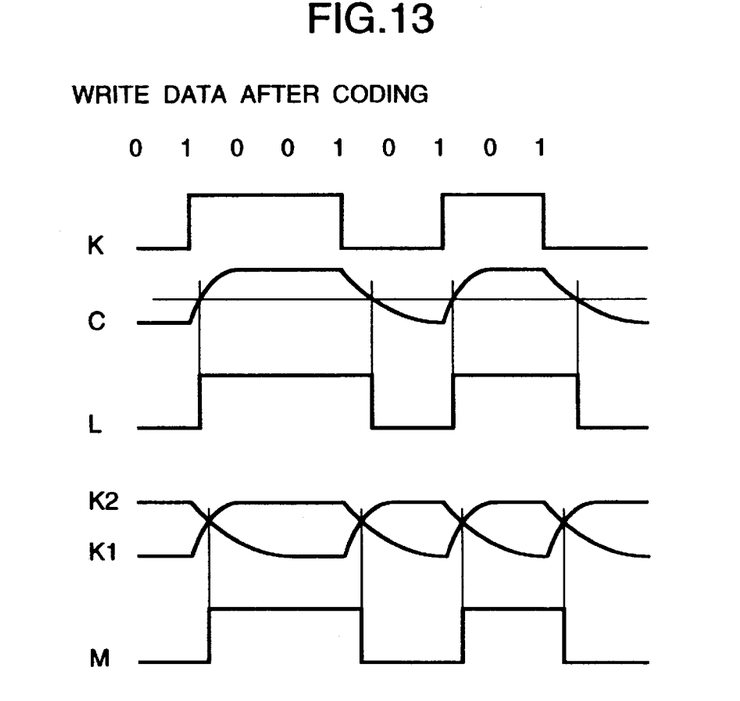
FIG. 13 is a waveform diagram to which reference is made in explaining the operation of the embodiment of FIG. 12.

The write data pulse signal K of NRZI code generated from the 1/2 prescaler 19 shown in FIGS. 9 and 12 is turned on or off at every "1" pulses of the write data train that was converted into the illustrated recording code as shown in FIG. 13. When this write data pulse signal K is transmitted as it is to the R/W amplifier 42 as shown in FIG. 9, the waveform of the transmitted write data pulse signal C becomes blunt at the leading edges and trailing edges as shown in FIG. 13. Since the write data pulse C transmitted on a single signal line is blunt in its waveform, it is shaped in its waveform by the buffer 17 (FIG. 9) of the R/W amplifier 42. In this case, the phase relation between the leading edge and the trailing edge is shifted from that of the original write data pulse signal K, and as a result the NRZI code L having a changed phase relation is produced. Since the shifted edges are used as data in the NRZI code, the changed phase relation acts as a factor of error in data and hence deteriorates the performance of the apparatus.

On the contrary, when the differential write data pulse signals K1 and K2 as a pair of the write data pulse signal C and the reverse thereof are transmitted from the R/W signal processor 53 to the R/W amplifier 52, the differential receiver 23 of the R/W amplifier 52 produces a signal M which turns on and off at the time points when the waveforms of the differential write data pulse signals K1 and K2 intersect each other (or are equal in level) even though the differential write data pulse signals K1 and K2 become blunt in their waveforms. Although the signal M is generally shifted in phase relative to the ideal-waveform write data pulse signal K generated from the 1/2 prescaler 19, it turns on and off at its leading edge and trailing edge with almost the same timing relation as that of the write data pulse signal K. Thus, error can be prevented from occurring in data.

The transmission of the differential write data pulse signals can be similarly made even in the embodiments shown in FIGS. 1 and 9, and thus the same effect can be achieved.

Figure 14:
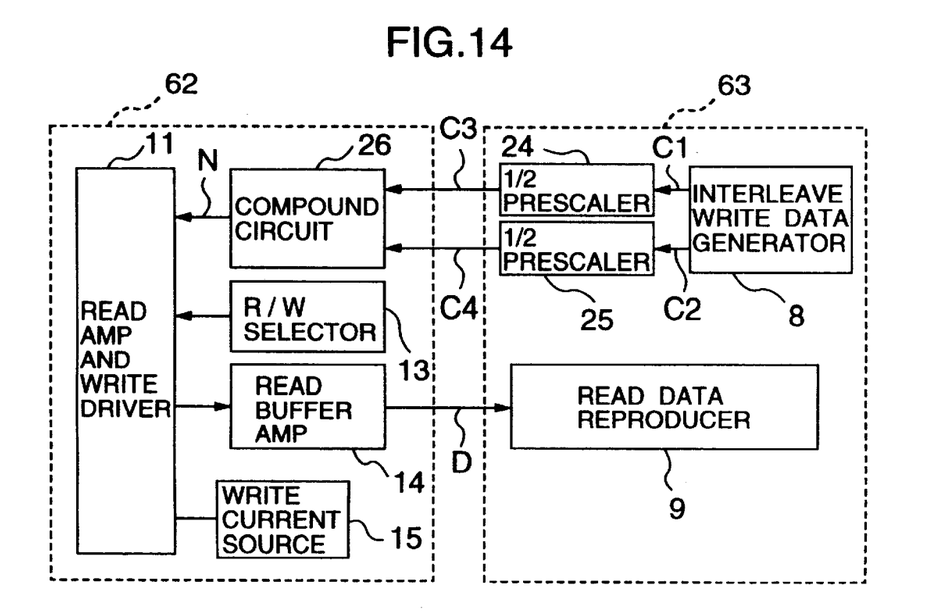
FIG. 14 is a block diagram of the R/W amplifier and R/W signal processor in further embodiment of the magnetic recording and reproducing apparatus of the invention.

FIG. 14 is a block diagram of the R/W amplifier 62 and R/W signal processor 63 in further embodiment of the magnetic recording and reproducing apparatus of the invention. In FIG. 14, reference numerals 24 and 25 represent 1/2 prescalers, and like elements corresponding to those in FIG. 2 are identified by the same reference numerals and will not be described.

Figure 15:
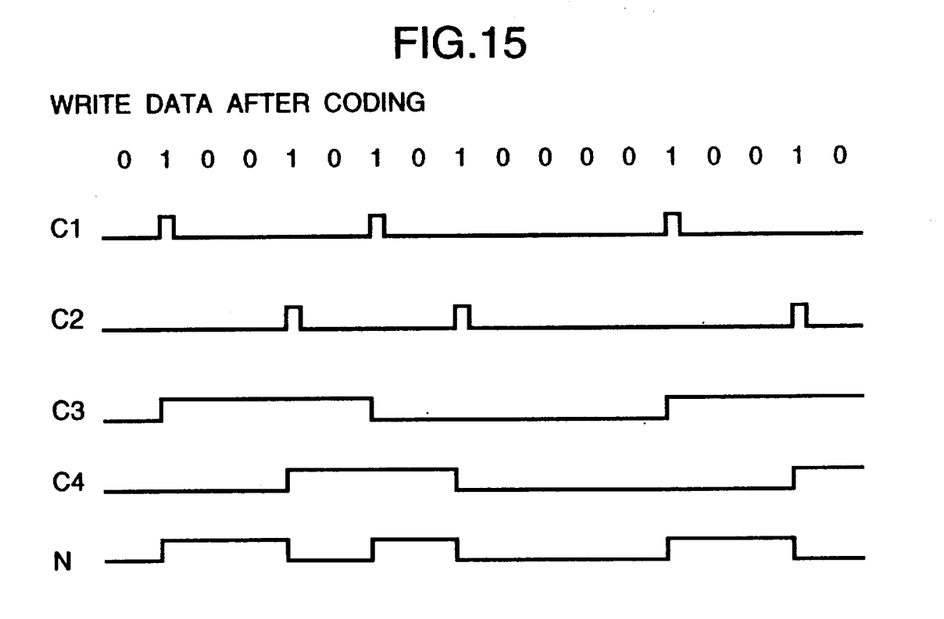
FIG. 15 is a timing chart for signals at respective portions in FIG. 14.

FIG. 15 is a timing chart for signals at respective portions in FIG. 14. In FIG. 15, like signals corresponding to those in FIG. 14 are identified by the same reference numerals.

This embodiment makes the same interleave and NRZI code transmission of write data pulse signal between the R/W amplifier 62 and the R/W signal processor 63 as described in the embodiment of FIG. 1.

Referring to FIGS. 14 and 15, as is similar to the description with respect to FIG. 3, the interleave write data generator 8 generates the interleave write data signals C1 and C2 from the coded write data train, and these data signals are respectively divided in their frequency by the 1/2 prescalers 24 and 25, thereby converted into interleave write data signals C3 and C4 of NRZI code. These interleave data signals C3 and C4 are supplied to the R/W amplifier 62, where they are combined by the compound circuit 26 into a signal N. The compound circuit 26 can be formed of, for example, an exclusive OR circuit. The write driver 11 supplies the current pulse according to this composite signal N to the magnetic head.

Even in this embodiment, the write data pulses C3 and C4 may be such differential write data pulse signals as mentioned with reference to FIGS. 12 and 13. Thus, these write data pulse signals C3 and C4 can be prevented from changing the timing relation between the leading edge and the trailing edge.

In the embodiments mentioned above, the R/W amplifier 62 and the R/W signal processor 63 may be formed as ICs and an inexpensive transmission line with low transmission ability may be connected between these ICs. Even in this case, the write data pulse signal can be transmitted at high speed without causing blunt waveforms.

Thus, according to this invention, the write data frequency can be reduced to ½ by employing the interleave data system or NRZI code system or ¼ or below by combining both systems. Thus, it is possible to make data transfer at a high speed of 20 MB/sec or above.

Figure 20:
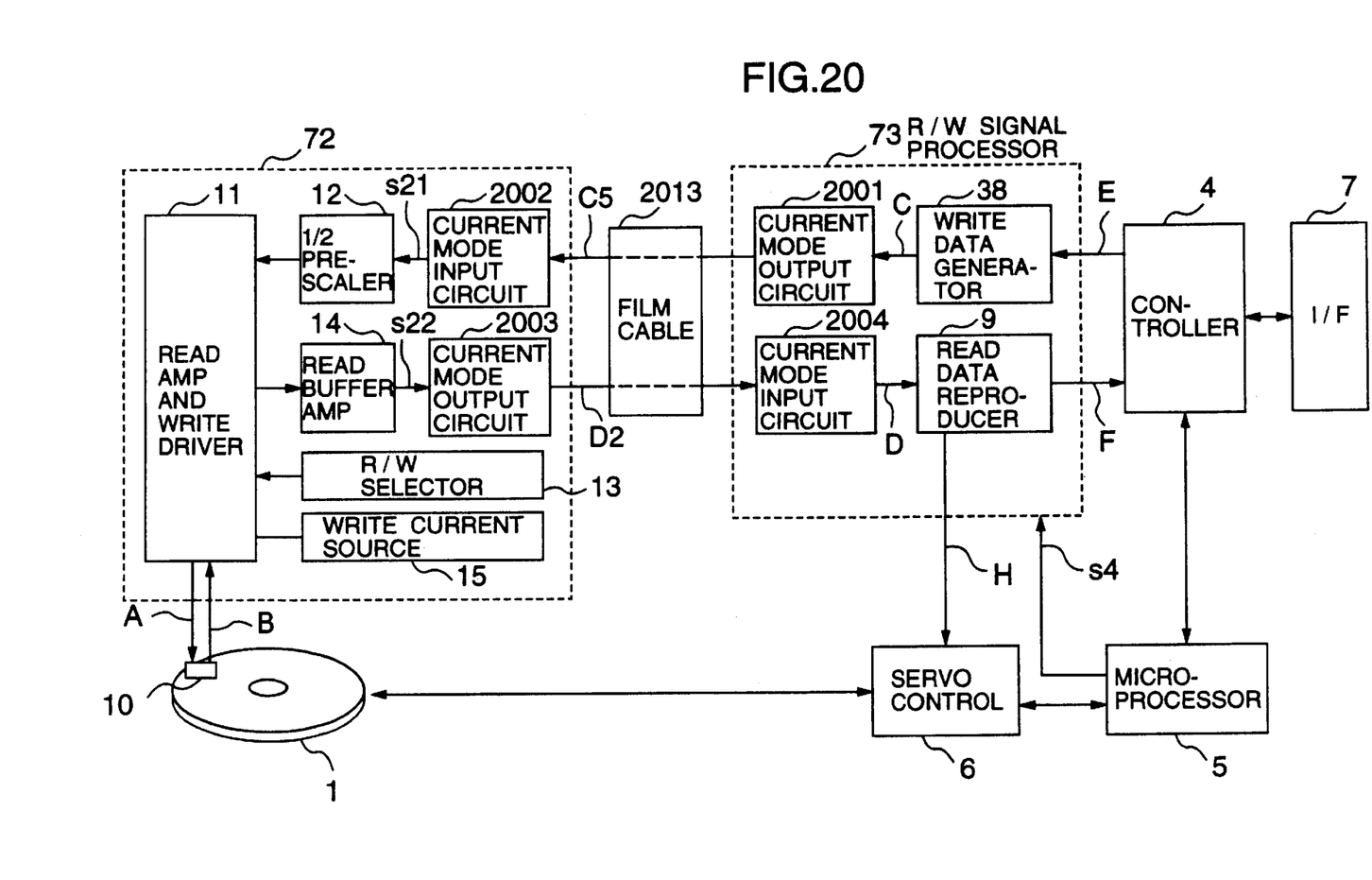
FIG. 20 is a block diagram of still further embodiment of the magnetic recording and reproducing apparatus of the invention.

FIG. 20 is a block diagram of still further embodiment of the magnetic recording and reproducing apparatus of the invention. In this embodiment, current mode input circuits and current mode output circuits 2001 through 2004 which make it possible to transmit and receive the write data signal C and read data signal D in current mode are provided in the R/W signal processor 73 and R/W amplifier 72. The other elements are the same as in FIG. 16.

Figure 21:
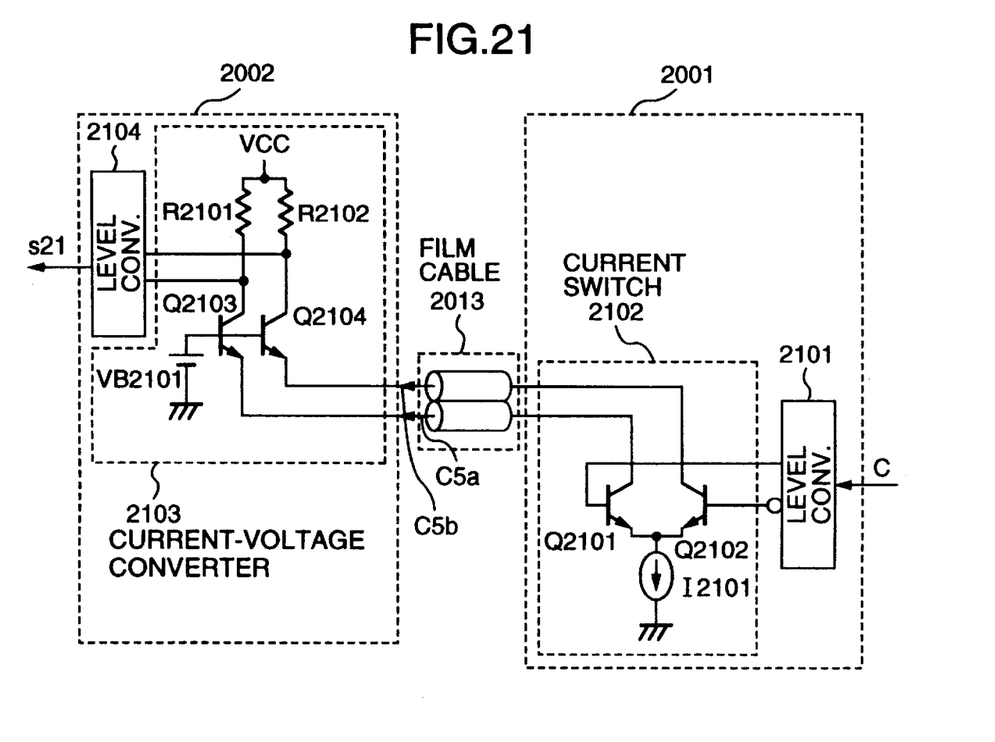
FIG. 21 is a block diagram of the current mode output circuit and input circuit for write data in FIG. 20.

FIG. 21 is a diagram of a specific example of the constructions of the current mode output circuit 2001 and current mode input circuit 2002, showing the operation of transmitting and receiving write data signal C. The write data C from the write data generator 38 is converted in level by a level converter 2101 within the current mode output circuit 2001, and then converted into current mode signals C5a and C5b by a current switch 2102 which is formed of transistors Q2101, Q2102 and a current source I2101.

The current mode input circuit 2002 is comprised of a current-voltage converter 2103 and a level converter 2104, and the current-voltage converter 2103 is formed of transistors Q2103, Q2104, resistors R2101, R2102 and a voltage source VB2101. The current mode write data signals C5a and C5b fed through a film cable 2013 to the R/W amplifier 72 are supplied to the emitter terminals of the transistors Q2103 and Q2104 and converted into voltages across the resistors R2101 and R2102. These voltages are fed to the level converter 2104, by which they are converted into signal levels matched with the internal circuits. The emitter terminals of transistors Q2103 and Q2104 which serve as the input terminals of the current mode input circuit 2002 have potentials suppressed to a change of several tens mV because the base terminals are connected to the voltage source VB2101. Therefore, the write data of a small amplitude can be transmitted. In addition, the input impedance corresponds to the AC emitter resistance depending on the input current. If the characteristic impedance of the film cable 2013 is 50Ω, the input impedance can be designed to be about 50Ω by setting the voltage source VB2101 so that the input current is 0.5 mA. Thus, impedance matching can be achieved without use of a termination resistor.

Figure 22:
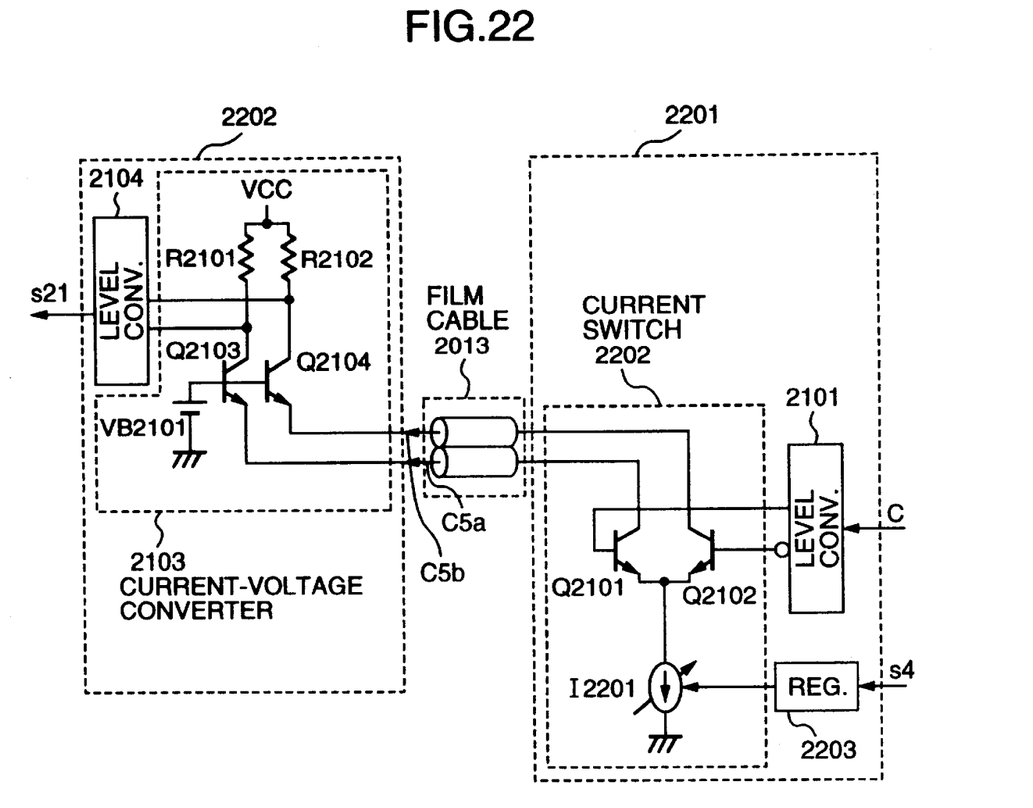
FIG. 22 is a block diagram of another construction of the current mode output circuit for write data in FIG. 20.

FIG. 22 shows a specific example of the current mode output circuit, 2201. The current switch, 2202 has a variable current source I2201 of which the output current can be externally controlled. Also, a register 2203 is provided of which the contents can be changed by a control signal S4 from the microprocessor 5. The output current from the current source I2201 is controlled by the value of the register 2203. Thus, the output current can be changed in a programmable way. The microprocessor 5 is programmed in order that the value equal to the known characteristic impedance of the film cable 2013 is set in the register 2203. As a result, impedance matching can be precisely achieved, without adding a terminal resistance, according to the characteristic impedance of the film cable 2013 interposed between the amplifier and the processor.

The write data may be of any code system such as RZ code, NRZI code or interleave mode, or this invention can be applied to the apparatus without depending on the code system of the write data.

The operation of each circuit about the transmission of read data signal between the R/W signal processor and the R/W amplifier will be described with reference to FIG. 20.

The read data signal B read from the recording medium 1 is amplified by the read amplifier 11 of the R/W amplifier 72, and then fed through the read buffer amplifier 14 to the current mode output circuit 2003 by which it is converted into a current mode read signal D2. The read data signal D2 is transmitted through the film cable 2013 to the R/W signal processor 73 where it is converted by the current mode input circuit 2004 into a voltage, which is then supplied to the read data reproducer 9.

Figure 23:
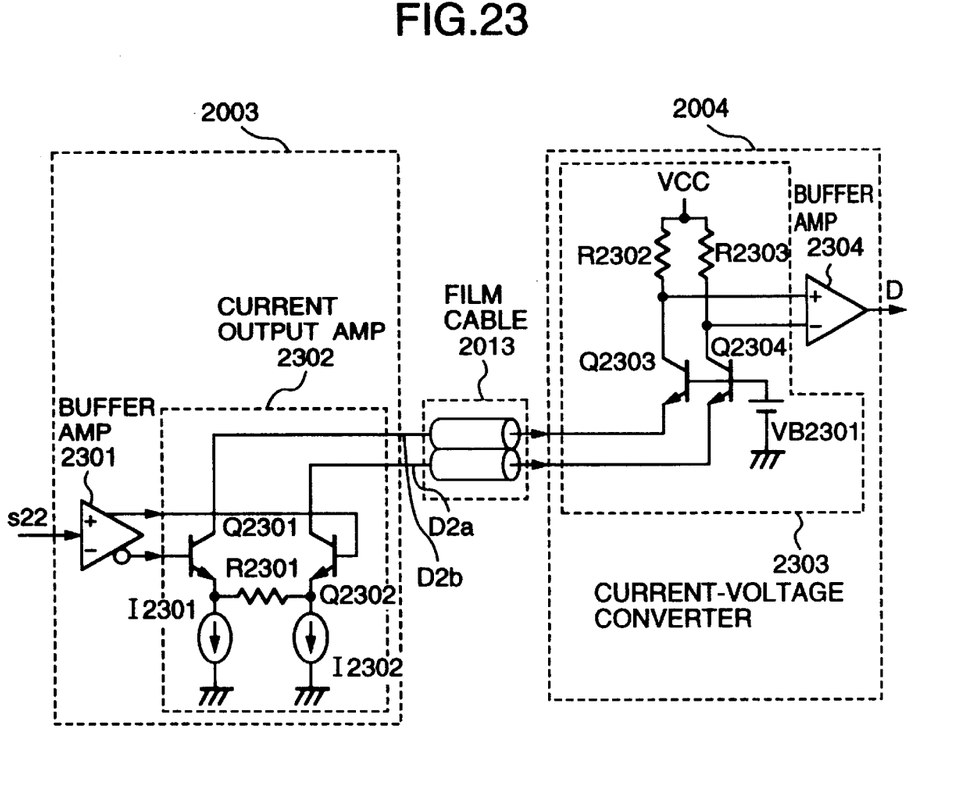
FIG. 23 is a block diagram of still another construction of the current mode output circuit and input circuit for read data in FIG. 20.

FIG. 23 shows a specific example of the current mode output circuit 2003 and current mode input circuit 2004. The current mode output circuit 2003 is formed of a buffer amplifier 2301 and a current output amplifier 2302. The current output amplifier 2302 is formed by a gm amplifier which includes transistors Q2301, Q2302, a resistor R2301 and current sources I2301, I2302.

The current mode input circuit 2004 is formed of a current-voltage converter 2303 and a buffer amplifier 2304. The read data signals D2a, D2b transmitted in a current mode are fed to the current-voltage converter 2303 by which they are converted into voltages which are then fed through the buffer amplifier 2304 to the read data reproducer 9. Since the current-voltage converter 2303 has the bases of the transistors grounded as does the current-voltage converter 2103 of FIG. 21, the potential change at the input terminal can be suppressed to several tens mV. Therefore, the read data signal D2 of a small amplitude can be transmitted between the R/W amplifier 72 and the R/W signal processor 73.

The consumption current in the output circuit using a film cable of 50Ω in this embodiment will be compared with that in the prior art. In the prior art, if the write data of ECL level (an amplitude of 0.8 V) is transmitted, the consumption power in the output circuit is about 100 mW. According to this invention, the output current can be fixed to 2 mA or below and the consumption power with an amplitude of about 50 mV can be reduced to 20 mW, or ⅕ that in the prior art.

In addition, since the output current can be set in accordance with the characteristic of the film cable, precise impedance matching can be achieved, and the film cable to be used and the circuits to which the film cable is connected can be designed and changed with high degree of freedom.

What is claimed is:

1. A magnetic recording and reproducing apparatus transmitting data between a read/write signal processor and a read/write amplifier, for recording and reproducing the data to and from a magnetic recording medium through the read/write amplifier, comprising:

a read/write signal processor having an interleave write data generator for generating a plurality of interleave write data in an interleave relation with each other from write data; and a read/write amplifier having a compound circuit for restoring the plurality of interleave write data into original write data;

wherein the read/write signal processor is connected to the read/write amplifier by a plurality of signal lines, whereby each of the plurality of interleave write data is transmitted from the read/write signal processor to the read/write amplifier by using the plurality of signal lines.

2. A magnetic recording and reproducing apparatus according to claim 1, wherein each of the interleave write data includes differential signals.

3. A read/write amplifier for use in the magnetic recording and reproducing apparatus according to claim 1, wherein the read/write amplifier further includes a compound circuit for combining the plurality of interleave write data, said read/write amplifier being an integrated circuit.

4. A magnetic recording and reproducing apparatus according to claim 1, wherein said plurality of interleave write data more specifically have a predetermined alternating interleave relation with each other.

5. A magnetic recording apparatus using a write head for writing data in a magnetic recording medium:

a recording code generating circuit converting supplied write data into a recording code suitable for recording on the magnetic recording medium, and outputting the converted write data; and a processing circuit for converting the converted write data generated by the recording code generating circuit into data for writing by the write head, wherein the recording code generating circuit is connected to the processing circuit by a plurality of signal lines in parallel; and the processing circuit receives the converted write data in parallel to generate in series for writing to the magnetic recording medium using the write head.

6. A magnetic recording apparatus according to claim 5, wherein the recording code generating circuit receives the write data supplied to generate the recording code through a plurality of signal lines.

7. A magnetic recording apparatus according to claim 6, wherein the recording code generating circuit generates a plurality of interleave write data in an interleave relation with each other as write data for output in parallel; and wherein the processing circuit includes a compound circuit for restoring the plurality of interleave data to original write data.

8. A magnetic recording and reproducing apparatus transmitting data between a read/write signal processor and a read/write amplifier, for recording and reproducing the data to and from a magnetic recording medium through the read/write amplifier, comprising:

a read/write signal processor having an interleave write data generator for receiving serial write data and serial-to-parallel converting said serial write data to plural groups of interleave write data, with different groups having a predetermined alternating interleave relation with other groups;

a read/write amplifier having a de-interleave write data generator for receiving said groups of interleave write data and parallel-to-serial converting said groups of interleave write data to write data;

wherein the read/write signal processor is connected to the read/write amplifier by a plurality of signal lines, whereby each of the plural groups of interleave write data is transmitted from the read/write signal processor to the read/write amplifier by using the plurality of signal lines.

* * * * *